(12) United States Patent
Gann et al.

(10) Patent No.: US 8,475,560 B2
(45) Date of Patent: Jul. 2, 2013

(54) METHOD FOR PRODUCING SILVER NANOFILAMENTS

(75) Inventors: John P. Gann, Portland, OR (US); Sophie Truc Lam, Beaverton, OR (US)

(73) Assignee: Kimberly-Clark Worldwide, Inc., Neenah, WI (US)

( * ) Notice: Subject to any disclaimer, the term of this patent is extended or adjusted under 35 U.S.C. 154(b) by 301 days.

(21) Appl. No.: 13/070,847

(22) Filed: Mar. 24, 2011

(65) Prior Publication Data

US 2012/0240728 A1    Sep. 27, 2012

(51) Int. Cl.
*B22F 9/20* (2006.01)
*B82Y 40/00* (2011.01)

(52) U.S. Cl.
USPC .............................. 75/371; 75/721; 977/896

(58) Field of Classification Search
None
See application file for complete search history.

(56) References Cited

U.S. PATENT DOCUMENTS

| | | | | |
|---|---|---|---|---|
| 7,585,349 | B2 * | 9/2009 | Xia et al. | 75/371 |
| 2010/0037731 | A1 * | 2/2010 | Li | 75/370 |

OTHER PUBLICATIONS

Caswell, K.K. et al., "Seedless, Surfactantless Wet Chemical Synthesis of Silver Nanowires," Nano Letters, vol. 3, No. 5, 2003, pp. 667-669.
Gou, Linfeng et al., "Convenient, Rapid Synthesis of Ag Nanowires," Chemistry of Materials, vol. 19, 2007, pp. 1755-1760.
Liu, Suwen et al., "Room Temperature Synthesis of Silver Nanowires from Tabular Silver Bromide Crystals in the Presence of Gelatin," Journal of Solid State Chemistry, vol. 179, 2006, pp. 696-701.
Wei, Gang et al., "One-Step Synthesis of Silver Nanoparticles, Nanorods, and Nanowires on the Surface of DNA Network," Journal of Physical Chemistry B, vol. 109, No. 18, 2005, pp. 8738-8743.

* cited by examiner

*Primary Examiner* — George Wyszomierski
(74) *Attorney, Agent, or Firm* — Karl V. Sidor

(57) ABSTRACT

A method of producing silver nanofilaments that is relatively fast and may be carried out at normal room temperatures (e.g., from about 10° C. to about 25° C.). The method of producing silver nanofilaments includes the steps of adding a solid silver salt to liquid ether to form a mixture, adding a liquid fatty acid to the mixture, adding a reducing agent to the mixture, allowing the ingredients to react, and recovering silver nanofilaments.

18 Claims, 5 Drawing Sheets

US 8,475,560 B2

METHOD FOR PRODUCING SILVER NANOFILAMENTS

FIELD OF THE INVENTION

The present invention relates to methods for producing nanofilaments of silver.

BACKGROUND

Spherical silver nanoparticles are readily synthesized. It is thought that spherical nanoparticles are more easily formed than elongated filaments or wires of similar scale due to the low surface energy to volume ratio afforded by the spherical shape. There are numerous published accounts of synthetic routes for making silver nanoparticles including the description in U.S. Patent Application Publication Number 2007/0003603 for "Antimicrobial Silver Compositions" published Jan. 4, 2007 and U.S. Patent Application Publication Number 2007/0207335 for "Methods and Compositions For Metal Nanoparticle Treated Surfaces" published Sep. 6, 2007. Elongated nanostructures such as nanowires, nanofilaments and nanorods, however, are less common in the literature.

Production of silver nanofilaments such as nanowires can be divided in to template-assisted and template-free methods. Template-assisted methods utilize a template such as, for example, carbon nanotubes, porous $TiO_2$ or similar structure that will induce silver to grow into nanometer scale filaments or wires. Features such as diameter and length can be controlled by carefully selecting the appropriate template. However, template-assisted methods yield silver structures that are impure because of the difficulty of separating the silver from the template. In addition, template-assisted methods generally have low efficiencies and require hours or days for synthesis.

Template-free methods generally involve reducing the silver metal nanometer scale filament or wire from silver salt at elevated temperatures (e.g., about 80° C. to about 150° C.). Features such as diameter and length can be controlled by adjusting the amount of surfactant or by carefully selecting the reducing agent. Template-free methods generally have low efficiencies and typically require hours or even days to obtain milligram levels of output from the synthesis.

Microwave synthesis of silver nanometer scale wires using a template-free method is described in the literature. However, wire formation is highly dependent on the microwave heating power, time and ratios of certain ingredients.

Exemplary methods of producing nanometer scale wires may be found in, for example, U.S. Patent Application Publication No. 2005/0056118; U.S. Patent Application Publication No. 2007/0074316; U.S. Patent Application Publication No. 2009/0311530; U.S. Patent Application Publication No. 2009/0196788; U.S. Patent Application Publication No. 2010/0148132; J. Phys. Chem. B, 2005, 109, 8379; Journal of Solid State Chemistry, Volume 179, 2009, p. 696; Chemistry of Materials 2007, 19, 1755; and Nano Letters Vol. 3, No. 5, 667.

Although many methods for producing silver nanofilaments or nanowires have been proposed in these documents and the like, there still has been a demand for producing such nanofilaments or nanowires simply, efficiently, and cost effectively in a short time without using an aqueous solvent, pressurization by an autoclave or the like. Moreover, it is desired to prevent silver nanofilaments or nanowires from being oxidized.

Accordingly, there is a need for a simple method of producing silver nanofilaments or nanowires. For example, there is a need for a simple method of producing silver nanofilaments or nanowires without requiring days or hours to carry out the synthesis. There is also a need for a simple method of producing silver nanofilaments or nanowires that is efficient and easy to control.

SUMMARY

In response to the difficulties and problems discussed herein, the present invention provides a simple method of producing silver nanofilaments that is relatively fast and may be carried out at normal room temperatures (e.g., from about 10° C. to about 25° C.). The method of producing silver nanofilaments generally includes the steps of adding a solid silver salt to liquid ether to form a mixture, adding a liquid fatty acid to the mixture, adding a reducing agent to the mixture, allowing the ingredients to react, and recovering silver nanofilaments.

The solid silver salt may be silver nitrate. It is contemplated that silver salt may be silver acetate, silver lactate, silver citrate, and silver perchlorate or the like.

The liquid ether is desirably tetrahydrofuran. It is contemplated that the liquid ether may be diethyl ether, di-tert-butyl ether, diglycol methyl ether, diisopropyl ether, dimethoxyethane, dimethoxymethane, dioxane, ethyl tert-butyl ether, methoxyethane, methyl tert-butyl ether, 2-methyltetrahydrofuran, tetrahydrofuran, dioxane, and tetrahydropyran and combinations thereof (including combinations with tetrahydrofuran) may be used.

A liquid fatty acid is added to the mixture of the silver salt and liquid ether. The liquid fatty acid is an unsaturated fatty acid and is desirably a long-chain fatty acid. Oleic acid has been found to work well. It is contemplated that other long-chain fatty acids such as myristoleic acid, palmitoleic acid, sapienic acid, linoleic acid, and alpha-linoleic acid and combinations thereof (including combinations with oleic acid) may be used.

A reducing agent is added to the mixture. The reducing agent is desirably tetramethylethylene diamine. It is contemplated that other polyamine reducing agents may be used. Combinations of polyamines and/or diamines may be used and such combinations may include combinations with tetramethylethylene diamine.

According to the invention, the ingredients are allowed to react at conditions at or near normal room temperatures. The reaction is carried out for relatively shorter reaction times than other methods. For example, the method may be carried out at temperatures ranging from about 5° C. to about 35° C. As another example, the method may be carried out at temperatures ranging from about 10° C. to about 30° C. As yet another example, the method may be carried out at temperatures ranging from about 15° C. to about 25° C. As still another example, the method may be carried out at temperatures around 20° C. The ingredients may be allowed to react for a time ranging from about 10 minutes and about 120 minutes. For example, the ingredients may be allowed to react for a time ranging from about 15 minutes and about 180 minutes. As another example, the ingredients may be allowed to react for a time ranging from about 20 minutes and about 120 minutes. As yet another example, the ingredients are allowed to react for a time ranging from about 30 minutes and about 90 minutes.

While the method is readily carried out be creating individual batches and could be practiced as a batch method, it is contemplated that the method may be carried out as a semi-continuous process or as a continuous process.

After the ingredients have reacted, silver nanofilaments are recovered. The nanofilaments may be washed and/or centrifuged to separate particles.

Other objects, advantages and applications of the present disclosure will be made clear by the following detailed description.

DETAILED DESCRIPTION

Figure 1:
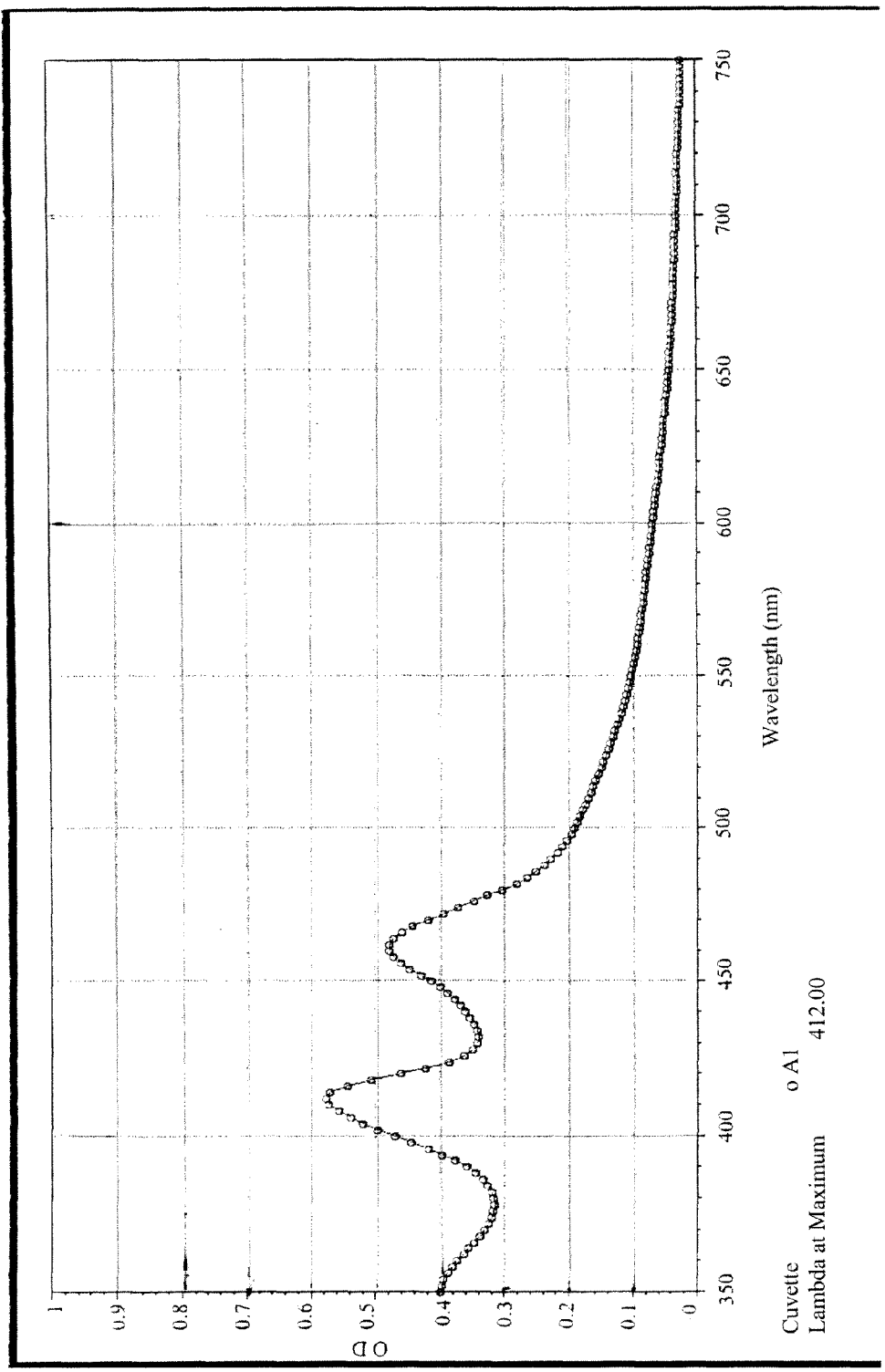
FIG. 1 is an exemplary ultraviolet-visible spectrum of silver nanofilaments in tetrahydrofuran that was generated utilizing an UV/Vis spectrophotometer.

Reference will now be made in detail to one or more embodiments, examples of which are illustrated in the drawings. It should be understood that features illustrated or described as part of one embodiment may be used with another embodiment to yield still a further embodiment. It is intended that the claims include these and other modifications and variations as coming within the scope and spirit of the disclosure.

For purposes of the present inventions, the terms "nanofilament" and "nanowire" are used interchangeably and refer to a nanostructure which have a thickness or diameter constrained to tens of nanometers ($10^{-9}$ meters) or less and an unconstrained length. Desirably, a nanofilament or nanowire has a thickness or diameter on the order of a nanometer ($10^{-9}$ meters). Nanofilaments include structures that are branched or have folds or other distortions. In such situations, the structure should have an aspect ratio much greater than one (1). For example, the nanofilaments may have an aspect ratio of from 5 to 200 or ever greater. Nanofilaments made of silver have applications in field effect transistors due to their low electrical resistance. Nanofilaments made of silver have potential use in electrically conducting fabrics or materials including, but not limited to, nonwoven materials. In addition, silver has antimicrobial properties and a material such as, for example, a nonwoven material that incorporates or is coated with silver nanofilaments may have antimicrobial activity. The aspect ratio of the nanofilament may impact the orientation of the nanofilament if it is applied to a surface or incorporated in a material.

In response to the difficulties and problems discussed herein, the present invention provides a simple method of producing nanofilaments that is relatively fast and may be carried out at normal room temperatures (e.g., from about 10 C to about 25 C). The method of producing nanofilaments generally includes the steps of adding a metal salt to liquid ether to form a mixture, adding a liquid fatty acid to the mixture, adding a reducing agent to the mixture, allowing the ingredients to react, and recovering metal nanofilaments. To illustrate the invention and demonstrate its operation, silver nanofilaments were prepared and characterized. However, it is contemplated that nanofilaments may be made of other metals such as, for example, gold, platinum, indium, rhodium, palladium, nickel, copper or zinc.

The solid silver salt may be silver nitrate. It is contemplated that silver salt may be silver acetate, silver lactate, silver citrate, and silver perchlorate or the like. The solid silver salt should preferably be a dry, finely divided solid that can mix and dispersed readily when added to the liquid ether.

The liquid ether is desirably tetrahydrofuran (also occasionally referred to as THF; oxolane; 1,4-expoxybutane; butylene oxide; cyclotetramethylene oxide; oxacyclopentane; diethylene oxide; or tetra-methylene oxide). It is contemplated that the liquid ether may also be diethyl ether, di-tert-butyl ether, diglycol methyl ether, diisopropyl ether, dimethoxyethane, dimethoxymethane, dioxane, ethyl tert-butyl ether, methoxyethane, methyl tert-butyl ether, 2-methyltetrahydrofuran, tetrahydrofuran, dioxane, and tetrahydropyran. Combinations of these liquid ethers (including combinations with tetrahydrofuran) may be used. The liquid ether may desirably have a dipole moment ranging from about 0.4 to about 1.9. More desirably, the liquid ether may have a dipole moment ranging from about 1.5 to about 1.7

A liquid fatty acid is added to the mixture of the silver salt and liquid ether. The liquid fatty acid is an unsaturated fatty acid. The unsaturated fatty acid is desirably a long-chain fatty acid such as oleic acid. It is contemplated that other long-chain fatty acids such as myristoleic acid, palmitoleic acid, sapienic acid, linoleic acid, and alpha-linoleic acid and combinations thereof (including combinations with oleic acid) may be used.

A reducing agent is added to the mixture. After addition of the reducing agent, the silver salt slowly dissolves. Desirably, the reducing agent is tetramethylethylene diamine (also occasionally referred to as TEMED; TMEDA; 1,2-bis(dimethylamine)-ethane; or N,N,N',N'-tetramethyl-ethane-1,2-diamine). It is contemplated that other polyamine reducing agents may be used. For example, other diamines having from two to eight carbon atoms are thought to work well. Combinations of polyamines and/or diamines may be used and such combinations may include combinations with tetramethylethylene diamine.

According to the invention, the ingredients are allowed to react at conditions at or near normal room temperatures. The reaction begins quickly and nanofilaments begin developing in about 30 minutes or less. The reaction is essentially complete at 180 minutes. These reaction conditions are thought to be relatively shorter and easier to create than other methods that are carried out at normal room temperatures—particularly when other techniques require added energy inputs such as, for example, microwave energy.

For example, the method may be carried out at temperatures ranging from about 5° C. to about 35° C. As another example, the method may be carried out at temperatures ranging from about 10° C. to about 30° C. As yet another example, the method may be carried out at temperatures ranging from about 15° C. to about 25° C. As still another example, the method may be carried out at temperatures around 20° C.

The ingredients may be allowed to react for a time ranging from about 10 minutes and about 120 minutes. For example, the ingredients may be allowed to react for a time ranging from about 15 minutes and about 90 minutes. As another example, the ingredients may be allowed to react for a time ranging from about 20 minutes and about 75 minutes. As yet another example, the ingredients are allowed to react for a time ranging from about 30 minutes and about 60 minutes.

While the method is readily carried out be creating individual batches and could be practiced as a batch method, it is contemplated that the method may be carried out as a semi-continuous process or as a continuous process.

Without being held to a particular theory of operation, the relative molar ratios of ingredients for batch, semi-continuous or continuous processing may be employed:

Silver Nitrate=1 mole.
Tetrahydrofuran=425 moles.
Oleic Acid=from about 0.28 moles to about 1.1 moles.
Tetramethylethylene Diamine=from about 7 moles to about 14 moles.

That is, when one mole of silver nitrate is used in the method of the present invention, approximately 425 moles of tetrahydrofuran may be used. From about 0.2 to about 1 mole of oleic acid are added to the mixture of silver nitrate and tetrahydrofuran and from about 7 to about 14 moles of tetramethylethylene diamine are added. These ratios may be used to scale up or scale down the reaction. Of course, variations of these ratios are contemplated and may be manipulated to alter the yield and/or characteristics of the resulting silver nanofilaments.

After the ingredients have reacted, silver nanofilaments are recovered. The nanofilaments may be washed with water or other liquid and/or centrifuged to separate the nanofilaments utilizing conventional techniques.

When made of silver, the nanofilaments of the present invention have applications in field effect transistors due to their low electrical resistance. Silver nanofilaments have potential use in electrically conducting fabrics or materials including, but not limited to, nonwoven materials. In addition, silver has antimicrobial properties and a material such as, for example, a nonwoven material that incorporates or is coated with silver nanofilaments may have antimicrobial activity. The aspect ratio of the nanofilament may impact the orientation of the nanofilament if it is applied to a surface or incorporated in a material.

The silver nanofilaments of the present invention can also be the starting material for producing dry silver nanofilament powders suitable for material science and metallurgical applications. Such compositions, aqueous or non-aqueous could be atomized in high temperature environment to produce dry silver nanofilament powder. The compositions of the present invention can be produced on a large scale and, because they are prepared from relatively inexpensive chemicals, a commercial process could be quite feasible and could compete with other dry processes for silver nanofilament powder. Another advantage of the compositions of the present invention in producing dry silver nanofilament powders is that the nanofilaments have an average thickness or diameter of about 5 to 10 nanometers and a length on the scale of several hundred nanometers. It is thought that the size distribution is relatively narrow. These factors may provide advantages over silver nanopowders with broad size distribution produced by other processes.

Other applications for silver nanofilaments of the present invention are in the catalysis of oxidation of olefins, separation of olefinic compounds, as polishing slurries, dissipation of static charge from surfaces, increasing thermal conductivity of liquids, increasing electrical conductivity, in the preparation of radio frequency or similar radiation shields, in analytical chemistry for surface enhanced Raman spectroscopy.

The present invention is further described by the example which follows. Such example, however, is not to be construed as limiting in any way either the spirit or the scope of the present invention.

EXAMPLE

Experimental

To a 20 ml glass vial was added 50 mg of silver nitrate (about 0.00029 moles) in the form of a finely divided solid. To this was added 10 ml tetrahydrofuran (about 0.1233 moles). Next was added anywhere between 25 to 110 microliters of oleic acid (from about 0.00008 to about 0.00032 mole) followed by the addition of between 300 and 600 microliters tetramethylethylene diamine (from about 0.0020 to about 0.0040 mole).

The vial was then capped and allowed to stand unstirred at room temperature (approximately 21° C.). The nanofilaments began to develop after about 30 minutes. The reaction was complete after approximately 3 hours based on the lack of residual silver nitrate solid visible in the vial.

A portion of the resulting silver nanofilament suspension was diluted approximately 10 fold in tetrahydrofuran and the resulting diluted suspension was used for UV/Vis spectrophotometry. For the transmission electron microscopy (TEM) and energy-dispersive X-ray (EDX) spectroscopy, the samples were drop coated onto lacey carbon TEM grids.

Ultraviolet-Visible Spectroscopy

The nanofilaments are detected indirectly by ultraviolet-visible spectroscopy utilizing an UV/Vis spectrophotometer. The spectrum was collected on a Molecular Devices SpectraMax Plus 384 Spectrophotometer (available from Molecular Devices, Inc. of Sunnyvale, Calif.) by adding 300 microliters of the as prepared nanofilament solution to 3 milliliters of THF in an optical glass cuvette. Referring now to FIG. 1, there is shown an ultraviolet-visible spectrum of silver nanofilaments in tetrahydrofuran. As can be seen in FIG. 1, the readout shows two distinct absorption peaks. One peak is at 410 nm and the other peak is at 465 nm. Absorption spectra such as these are attributed to plasmon resonance from the electrons on the surface of the nanostructure. The absorption at 410 nm is due to absorption from spherical "spectator" nanoparticles and from absorption at the ends of the longer aspect ratio structures. The peak at 460 nm is due to resonance on the absorption on the sides of these structures. It is typical for high aspect ratio nanostructures to show two absorption peaks. The two distinct absorption peaks are characteristic of nanofilament suspensions.

Transmission Electron Microscopy

Figure 2:
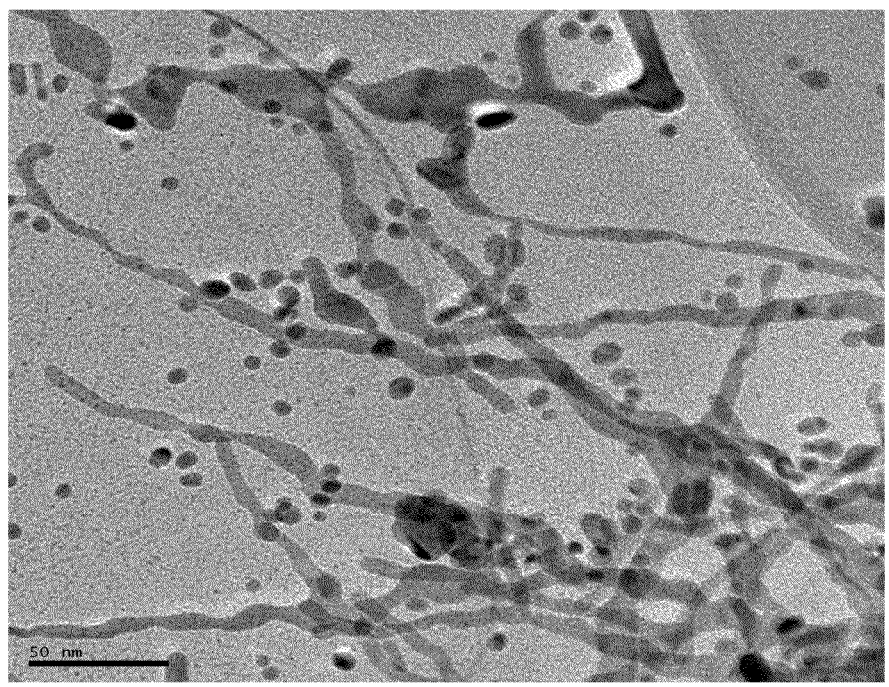
FIG. 2 is a photomicrograph made using transmission electron microscopy of exemplary silver nanofilaments.
Figure 3:
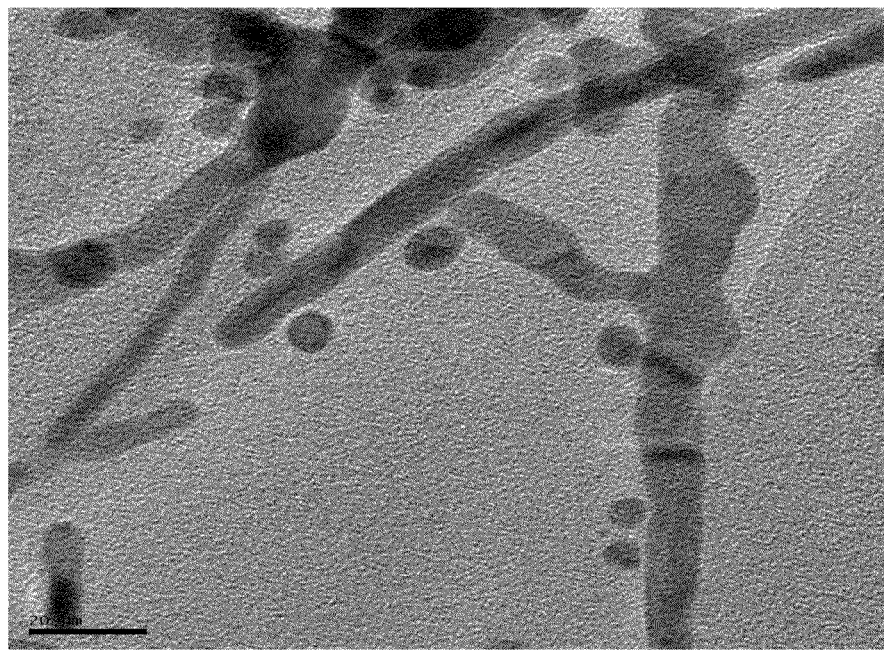
FIG. 3 is a photomicrograph of exemplary silver nanofilaments at about two and one-half times greater magnification than FIG. 2.

The nanofilaments were also observed using transmission electron microscopy (TEM). FIGS. 2 and 3 are photomicrographs of nanofilaments produced in the above-described example. FIG. 2 is a photomicrograph in which the scale bar in the lower left corner is 50 nanometers. FIG. 3 is a photomicrograph in which the scale bar in the lower left corner is 20 nanometers, which is about two and one-half times greater magnification. The photomicrographs were obtained using a FEI Tecnai F-20 TEM/STEM transmission electron microscope available from FEI Company of Hillsboro, Oreg. The FEI Tecnai F-20 was operated at 100 kV accelerating voltage. As can be seen from FIGS. 2 and 3, the silver nanofilaments are about 5 to 10 nanometers thick and several hundred nanometers in length.

Energy-Dispersive X-Ray (EDX) Spectroscopy

Figure 4:
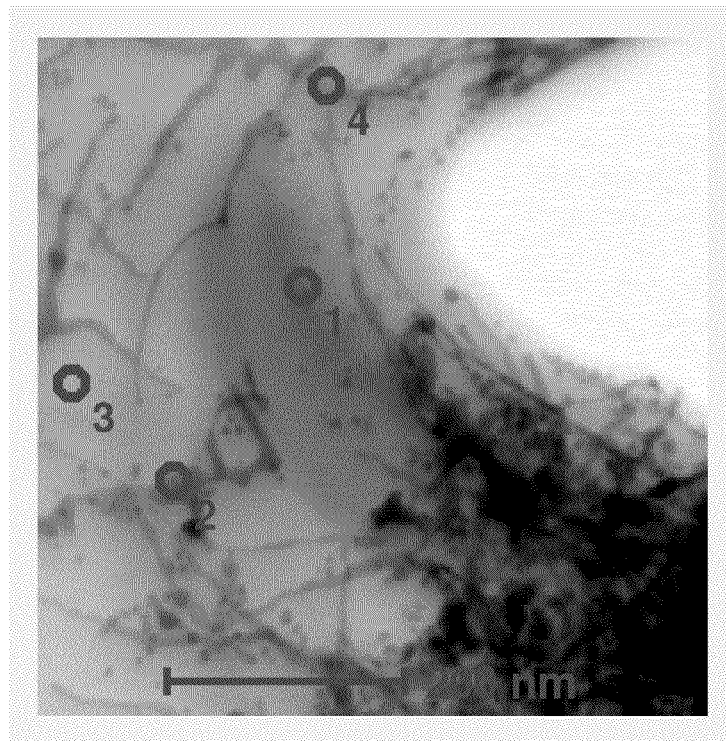
FIG. 4 is a photomicrograph made using transmission electron microscopy of an exemplary sample of silver nanofilaments showing four discrete points at which the sample was tested using energy-dispersive X-ray (EDX) spectroscopy.

FIG. 4 is a microphotograph of a sample of silver nanofilaments produced in the example describe above. The scale bar represents 200 nanometers. FIG. 4 shows four discrete points which are numbered as EDX Acquire Points 1 to 4 at which the sample was tested using EDX spectroscopy. The EDX spectra were taken using the FEI Tecnai F-20 TEM/STEM equipped with an EDAX EDX detector (also available from the FEI Company of Hillsboro, Oreg.) for chemical information. The samples were drop coated onto lacey carbon copper TEM grids prior to analysis.

FIGS. 5 to 8 are illustrations of the output of the EDX spectroscopy corresponding to each of the four points.

Figure 5:
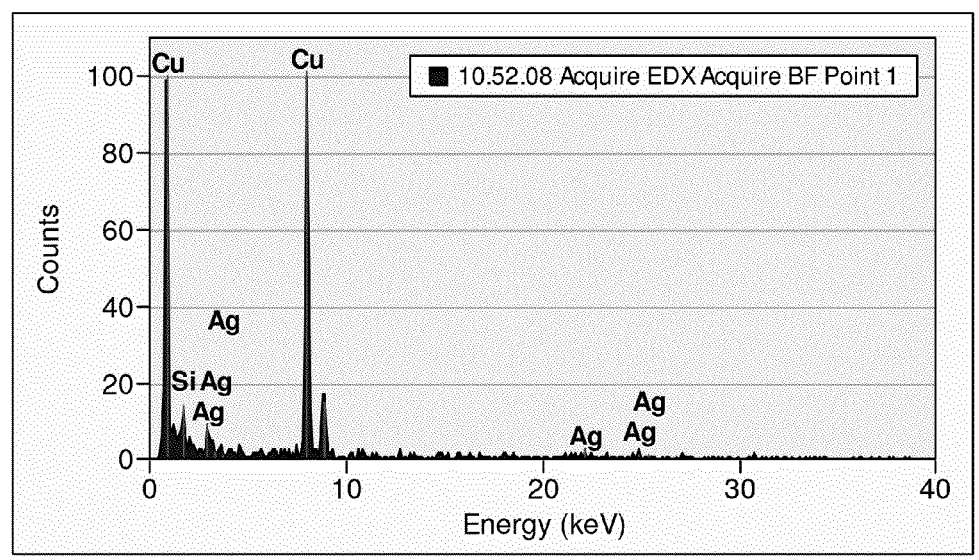
FIGS. 5 through 8 illustrate the output of EDX spectroscopy corresponding to each of the four discrete points identified in FIG. 4

FIG. 5 is an illustration of the output of EDX spectroscopy taken at EDX Acquire Point 1. This point is a location where the beam was targeted between the silver nanofilaments and corresponds to the TEM grid itself. The TEM grid was targeted to provide a reference or control of the background behind the silver nanofilaments. The EDX spectroscopy output of FIG. 5 shows a strong copper signal and only a slight signal from silver due to background.

Figure 6:
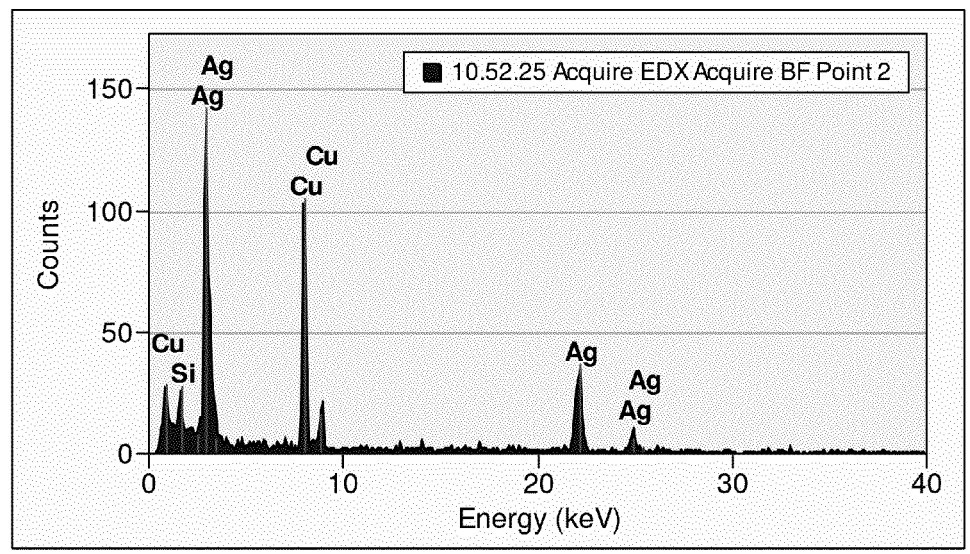

FIG. 6 is an illustration of the output of EDX spectroscopy taken at EDX Acquire Point 2. This point is a location where the beam was targeted directly on one of silver nanofilaments. FIG. 6 clearly shows a strong silver signal as well as a copper signal from the TEM grid.

Figure 7:
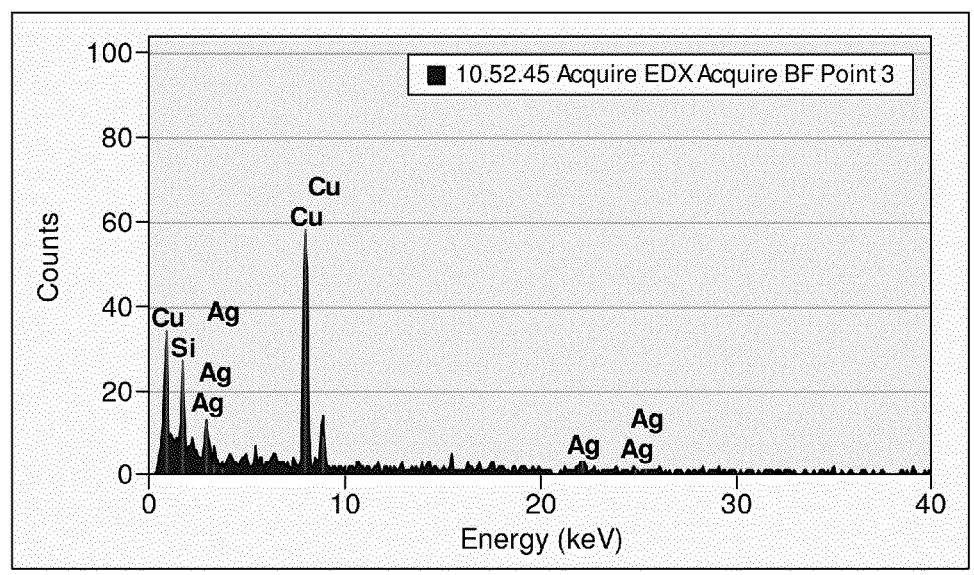

FIG. 7 is an illustration of the output of EDX spectroscopy taken at EDX Acquire Point 3. This point is also a location where the beam was targeted between the silver nanofilaments and corresponds to a location on the TEM grid different from EDX Acquire Point 1. In FIG. 7, the EDX spectroscopy shows a strong copper signal and only a slight signal from silver due to background.

Figure 8:
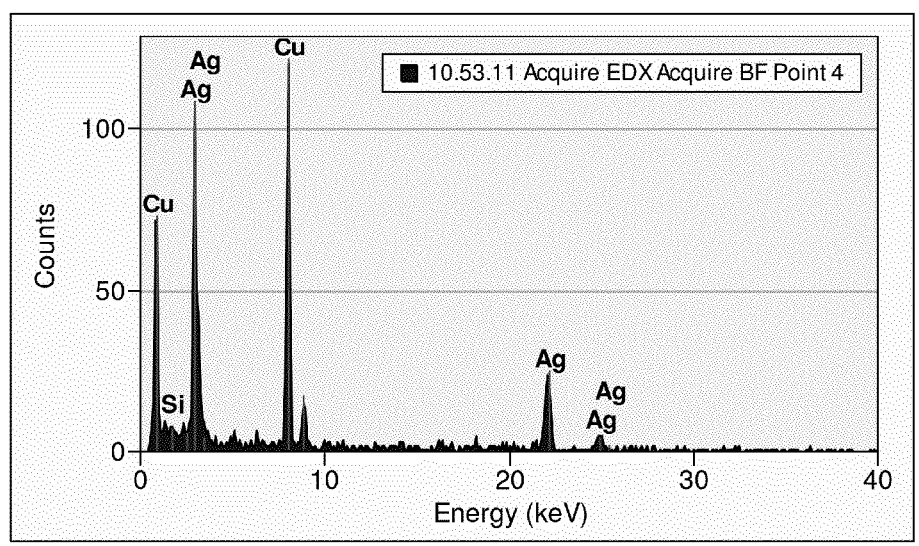

FIG. 8 is an illustration of the output of EDX spectroscopy taken at EDX Acquire Point 4. This point is a location where the beam was targeted directly on one of silver nanofilaments and corresponds to a location that is different from EDX Acquire Point 2. FIG. 8 clearly shows a strong silver signal as well as a copper signal from the TEM grid.

While the present invention has been described in connection with certain preferred embodiments it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

We claim:

1. A method of producing silver nanofilaments, the method comprising the steps of:
    adding a solid silver salt to liquid ether to form a mixture;
    adding a liquid fatty acid to the mixture;
    adding a reducing agent to the mixture;
    allowing the mixture to react; and
    recovering silver nanofilaments, wherein the method is carried out at temperatures ranging from about 15° C. to about 25° C.

2. The method of claim 1, wherein the silver salt is selected from the group consisting of silver nitrate and silver acetate.

3. The method of claim 1, wherein the liquid ether has a dipole moment ranging from about 0.4 to about 1.9.

4. The method of claim 3, wherein the liquid ether is selected from the group consisting of diethyl ether, di-tert-butyl ether, diglycol methyl ether, diisopropyl ether, dimethoxyethane, dimethoxymethane, dioxane, ethyl tert-butyl ether, methoxyethane, methyl tert-butyl ether, 2-methyltetrahydrofuran, tetrahydrofuran, dioxane, and tetrahydropyran and combinations thereof.

5. The method of claim 1, wherein the liquid fatty acid is an unsaturated fatty acid.

6. The method of claim 5, wherein the unsaturated fatty acid is a long-chain fatty acid.

7. The method of claim 6, wherein the long-chain fatty acid is selected from the group consisting of myristoleic acid, palmitoleic acid, sapienic acid, oleic acid, linoleic acid, and alpha-linoleic acid and combinations thereof.

8. The method of claim 1, wherein the reducing agent is a polyamine.

9. The method of claim 8, wherein the polyamine is a diamine.

10. The method of claim 9, wherein the polyamine is a diamine having from two to six carbon atoms.

11. The method of claim 10, wherein the diamine is tetramethylethylene diamine.

12. The method of claim 1, wherein the mixture is allowed to react for between about 15 minutes and about 180 minutes.

13. The method of claim 1, wherein the method is conducted as a continuous or semi-continuous method.

14. A method of producing silver nanofilaments comprising the steps of:
    adding solid silver salt selected from the group consisting of silver nitrate and silver acetate to a liquid ether selected from the group consisting of diethyl ether, di-tert-butyl ether, diglycol methyl ether, diisopropyl ether, dimethoxyethane, dimethoxymethane, dioxane, ethyl tert-butyl ether, methoxyethane, methyl tert-butyl ether, 2-methyltetrahydrofuran, tetrahydrofuran, dioxane, and tetrahydropyran and combinations thereof to form a mixture;
    adding a long-chain fatty acid selected from the group consisting of myristoleic acid, palmitoleic acid, sapienic acid, oleic acid, linoleic acid, and alpha-linoleic acid and combinations thereof to the mixture;
    adding a diamine reducing agent to the mixture;
    allowing the mixture to react for between about 15 minutes and about 180 minutes; and
    recovering silver nanofilaments, wherein the method is carried out at temperatures ranging from about 15° C. to about 25° C.

15. The method of claim 14, wherein the diamine reducing agent has from two to six carbon atoms.

16. The method of claim 15, wherein the diamine reducing agent is tetramethylethylene diamine.

17. A method of producing silver nanofilaments, the method comprising the steps of:
    adding solid silver nitrate to tetrahydrofuran to form a mixture;
    adding oleic acid to the mixture;
    adding a diamine reducing agent to the mixture;
    allowing the mixture to react for between about 15 minutes and about 180 minutes; and
    recovering silver nanofilaments, wherein the method is carried out at temperatures ranging from about 15° C. to about 25° C.

18. The method of claim 17, wherein the diamine reducing agent is tetramethylethylene diamine.

* * * * *